United States Patent

Gaillard

(10) Patent No.: US 7,960,275 B2
(45) Date of Patent: Jun. 14, 2011

(54) METHOD FOR MANUFACTURING AN INTERCONNECTION STRUCTURE WITH CAVITIES FOR AN INTEGRATED CIRCUIT

(75) Inventor: Frédéric-Xavier Gaillard, Voiron (FR)

(73) Assignee: Commissariat a l'Energie Atomique, Paris (FR)

( * ) Notice: Subject to any disclaimer, the term of this patent is extended or adjusted under 35 U.S.C. 154(b) by 540 days.

(21) Appl. No.: 12/046,056

(22) Filed: Mar. 11, 2008

(65) Prior Publication Data

US 2008/0227286 A1 Sep. 18, 2008

(30) Foreign Application Priority Data

Mar. 16, 2007 (FR) ..................................... 07 53885

(51) Int. Cl.
*H01L 21/4763* (2006.01)

(52) U.S. Cl. ................ 438/619; 257/E21.581; 438/411; 438/422

(58) Field of Classification Search .................. 438/619, 438/411, 422; 257/E21.581, 522
See application file for complete search history.

(56) References Cited

U.S. PATENT DOCUMENTS

| | | | |
|---|---|---|---|
| 6,261,942 B1 * | 7/2001 | Zhou et al. | 438/619 |
| 6,509,623 B2 * | 1/2003 | Zhao | 257/522 |
| 6,610,593 B2 * | 8/2003 | Kohl et al. | 438/623 |
| 7,510,959 B2 * | 3/2009 | Daamen et al. | 438/619 |
| 2004/0137728 A1 * | 7/2004 | Gallagher et al. | 438/689 |
| 2005/0037604 A1 | 2/2005 | Babich et al. | |
| 2006/0006538 A1 | 1/2006 | Allman et al. | |
| 2006/0216920 A1 | 9/2006 | Kojima | |
| 2008/0185722 A1 * | 8/2008 | Liu et al. | 257/751 |

OTHER PUBLICATIONS

K. Schulze, et al., "Formation of Air Gap Structures via wet etch removal of sacrificial dielectrics", Advanced Metallization Conference 2005 (AMC 2005), XP-008084926, 1 front page, pp. 309-316.
F. Gaillard, et al., "Chemical etching solutions for air gap formation using a sacrificial oxide/polimer approach", Microelectronic Engineering, vol. 83, No. 11-12, XP-002455759, Nov. 2006, pp. 2309-2313.

* cited by examiner

*Primary Examiner* — Kiesha R Bryant
*Assistant Examiner* — Mark W Tornow
(74) *Attorney, Agent, or Firm* — Oblon, Spivak, McClelland, Maier & Neustadt, L.L.P.

(57) ABSTRACT

A method for manufacturing a structure of electrical interconnections for an integrated circuit having levels of interconnections, the method having steps of depositing a layer of sacrificial material on the substrate, etching the layer of sacrificial material with a pattern corresponding to electrical conductors, depositing, on the etched layer of the layer of sacrificial material, a layer of permeable membrane allowing an attack agent to break down the sacrificial material, breaking down the sacrificial material by using the attack agent to form air gaps to replace the broken down sacrificial material, forming electrical conductors in the etched track so as to obtain electrical interconnections separated by air gaps, and depositing a layer of insulating material to cover the electrical interconnections.

5 Claims, 6 Drawing Sheets

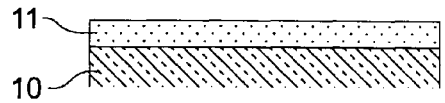
FIG.1A
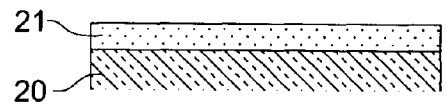
FIG.2A
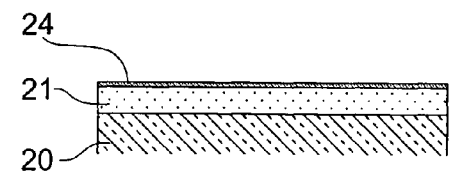
FIG.2B
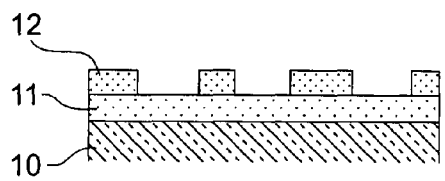
FIG.1B
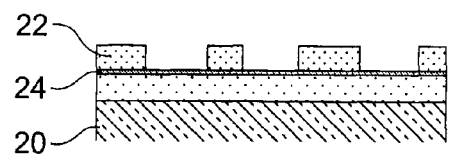
FIG.2C
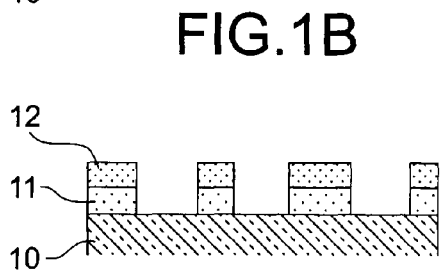
FIG.1C
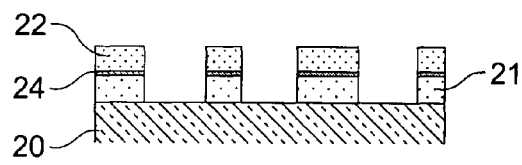
FIG.2D
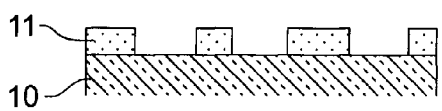
FIG.1D
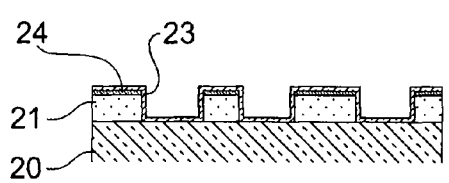
FIG.2E
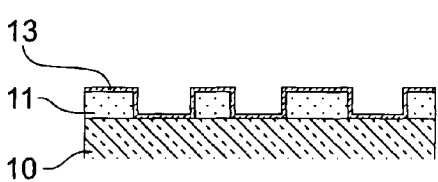
FIG.1E
FIG.2F

METHOD FOR MANUFACTURING AN INTERCONNECTION STRUCTURE WITH CAVITIES FOR AN INTEGRATED CIRCUIT

TECHNICAL FIELD

The invention relates to a method for manufacturing an interconnection structure with gaps for an integrated circuit.

STATE OF THE PRIOR ART

The introduction of "air gaps" in an interconnection structure is now considered for later generations of the 32 nm technology. Its use in interconnection structures can thus provide the necessary electrical performances which are imposed by the continuous reduction of the dimensions between copper tracks and dielectrics (component miniaturisation). This approach consists in replacing the current use of dielectric material between tracks of conductors (copper or aluminium) by air gaps of permittivity equal to 1.

For current generations of circuits, porous dielectric materials of low permittivity (dielectric constant approximately 2.3 to 2.7 have adequate characteristics to replace silicon oxides as isolators. However, the development efforts which are committed to searching for new materials do not necessarily justify the gain of a few tenths of a unit on future dielectric constant values. By replacing the isolating material by air ("Air Gap" concept), a major technological advance is anticipated.

At present, two types of approach have been broadly described. The first, referred to as "non-compliant deposit" consists of depositing a given dielectric material on the metallic interline sections. Integration constraints are then demanded, such as the defined "line height to width" ratio, a supplementary lithography step and a dedicated mask production, which represents a prohibitive cost for an industrial approach. On this matter, you can refer to the article "General review of issues and perspectives for advanced copper interconnections using air gaps as ultra low-k materials" by L. G. Gosset et al., Proceedings of the IEEE 2003 International Interconnect Technology Conference, (2003), 65.

The second approach uses a sacrificial material interleaved between several layers of dielectric material; this material is extracted after integration by means of various physico-chemical methods: thermal annealing, treatment by radiation. On this matter, you can refer to the article "Benefits and Trade-offs in Multi-Level Air Gap Integration" by R. J. O. M. Hoofman et al., Spring MRS, San Diego, United States, April 2006. The extraction can also be obtained by chemical attack, as the document FR-A-2 851 373 discloses (corresponding to American application 2004/229 454).

The objective of this approach is to "assemble" an integration over several interconnection levels with the sacrificial material and then to release the air gaps when the structure is finalised. Industrial interests are today focused on this latter approach. Unfortunately, whatever the approach considered (chemical attack or thermal damage), the development of new materials (porous membrane or thermally degradable material respectively) remains necessary, which does not allow reliable integration in the medium term.

On the other hand, problems specific to each approach can be detailed as follows. In the approach described in the document FR-A-2 851 373, the sacrificial material is silicon oxide and the attack solution used is a solution of hydrofluoric acid. In this context, the impacts of the chemical solution on the interconnection structure and in particular on the metallic tracks (corrosion of the copper, dissolution of the diffusion barriers, formation of fluorinated complexes, galvanic effect, etc.) or the materials present (porous membrane, adherence treatment in particular) are not negligible.

Similarly, for thermally degraded materials (see the article by R. J. O. M. Hoofman), their integration needs the complete development of new compatible "Back-End of line" dielectrics, which makes the development task considerable (thermally degradable material stable at a certain temperature and totally broken down at another, and having to be compatible with the thermal annealing temperatures of copper or of the material used at the level traversed, for example, etc.). Moreover, this degradable material must be broken down with efficiency close to 1, and the decomposition residues must be evacuated efficaciously through the membrane used at the level traversed to ensure satisfactory electrical performance (leakage current, capacitance, etc.) and stable over time.

EXPLANATION OF THE INVENTION

The invention presents a new method for producing air gaps over a number of levels in an interconnection structure. This method has the advantage, for the micro-electronics industry, of allowing the use of materials and methods already integrated and therefore accepted in manufacturing units, as well as being compatible with the nodes and therefore dimensions of the technologies concerned. The basic principle consists of producing air gaps delineated by a membrane before the metallic deposit of the line in question. The membrane is then formed according to the drawings of the mask and sufficiently rigid to be self-supporting when in place after formation of the gaps.

The object of the invention is therefore a method for manufacturing a structure of electrical interconnections of the damascene type for an integrated circuit, comprising at least one level of interconnections, consisting of electrical conductors arranged on a substrate and separated from one another by air gaps, a layer of electrically isolating material covering the level of interconnections, the method comprising steps consisting of:

depositing a layer of sacrificial material on the substrate,
   etching the layer of sacrificial material with a track corresponding to the electrical conductors,
   depositing, on the etched surface of the layer of sacrificial material, a layer of membrane in material permeable to an attack agent capable of breaking down the sacrificial material,
   breaking down the sacrificial material by means of the attack agent, which is how the air gaps are formed in place of the broken down sacrificial material,
   forming electrical conductors in the etched track so as to obtain electrical conductors separated by air gaps,
   depositing a layer of electrically isolating material so as to cover the level of interconnections obtained.

The method can also comprise a step consisting of depositing, before the step of etching the sacrificial material, a membrane consolidation layer in a material more dense than the layer of membrane, which is etched during the etching step and which is not broken down by the attack agent. It can then also comprise a step consisting of depositing, before the step of etching the sacrificial material, a layer of masking material on the membrane consolidation layer.

If the method comprises a step of depositing a membrane consolidation layer, it can also comprise, after the step of depositing the layer of porous material membrane and before the step of forming the electrical conductors, a step consisting of eliminating the parts of the porous material layer located at the base of the etched zones and on the non-etched parts of the layer of sacrificial material.

The step of forming the electrical conductors can comprise:
- a step of depositing a layer of an electrically conducting material with an etched track filling,
- a mechano-chemical polishing step performed until the membrane consolidation layer is revealed.

BRIEF DESCRIPTION OF THE DRAWINGS

The invention will be best understood and other advantages and features will become apparent on reading the description which follows, given as an example, but not limiting in any way, accompanied by the appended drawings, among which:

FIGS. 1A to 1E are views explaining a first embodiment according to this invention, FIGS. 2A to 2F are views explaining a second embodiment of the method according to this invention.

DETAILED EXPLANATION OF PARTICULAR EMBODIMENTS

Figure 3:
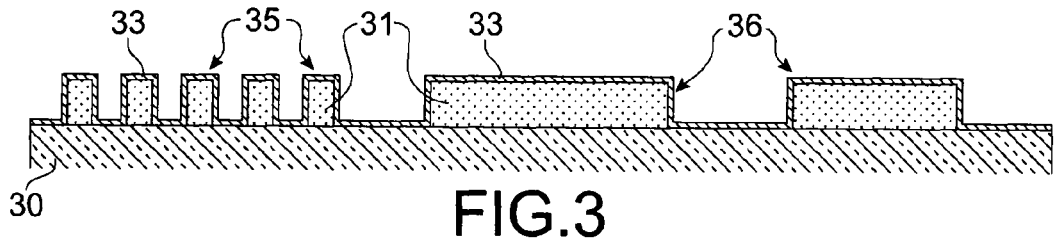
FIG. 3 is a view of a structure obtained by the method according to this invention, before the step of extracting the sacrificial material.

In the description which follows, we shall use the expression "air gap" to translate the expression rendered in French as "cavité d'air", although these gaps can be filled by another gas or be devoid of gas.

In the same way as for the approaches described previously, the method according to the invention relies on the use of a sacrificial material capable of being degraded either chemically, the most familiar example concerning the dissolution of combinations of $SiO_2$ such as USG (for "Undoped Silicate Glass") or FSG (for "Fluorinated Silicate Glass") by a solution of hydrofluoric acid, or thermally, by decomposition of a standard PMMA material, poly-methylmethacrylate, a material which breaks down at 300° C., or by plasma. $SiO_2$ integration by the chemical route as conventionally known is preferred, because of being integrated in former technologies (120 nm nodes as in the 90 s). In particular, this integration can maintain the integrity and an acceptable profile for the tracks during the etching phase (little or no curvature) and is thus a noteworthy advantage for the approach.

The production of these air gaps then consists of:
- Producing a deposit on a suitable substrate of a layer of sacrificial material ($SiO_2$, polymer, silicon, etc.) of thickness relevant to the technological node concerned by this type of approach.
- "Building" the integration (producing patterns for the formation of the metallic tracks) according to conventional micro-electronics methods (depositing of a hard mask, lithography, etching, elimination of resin, cleaning, etc.).
- Depositing the membrane permeable to the method of attack, of a thickness capable of extending to 50 nm and which will support the whole of the structure formed on the air gaps. By permeable is meant the fact that the membrane can allow the agent used to attack the sacrificial layer to diffuse, as well as the constituents resulting from the decomposition. This deposit can be made on two occasions, according to the needs of integration. In this latter case, the "membrane" would consist of two deposits: a first deposit of material, non-porous to the attack solution, or sealed, or with a high degree of selectivity—"speed of diffusion in the layer compared with the speed of decomposition of the sacrificial layer". This deposit is made before the etching step. A second deposit of permeable material of the same type is made on the walls after lithography and then etching. By permeable material is meant a material which lets the attack solution diffuse over its entire thickness, for example a material such as SiLK™ (deposited by plasma), SiC (deposited thinly by plasma (less than 40 nm, for example between 7 and 10 nm), for example by using precursors), a porous material (porous aluminium, porous silicon, porous SiC, SiON) or made porous by means of an electrochemical method of by modifying the depositing conditions.

FIGS. 1A to 1E are views explaining a first embodiment according to the invention.

FIG. 1A shows a substrate 10, the constitution of which does not need to be detailed to explain the method. On the substrate 10 is deposited a layer of sacrificial material 11, for example a layer of $SiO_2$, by a technique familiar to those skilled in the art.

The conventional integration steps are then pursued:
- definition of an interconnection track by a process of lithography using a layer of resin 12 or a hard mask on the sacrificial layer 11 (see FIG. 1B),
- etching of the sacrificial layer 11 through the mask 12 until the substrate 10 is revealed (see FIG. 1C),
- elimination (or "stripping") of the mask (see FIG. 1D).

A porous membrane 13 (see FIG. 1E) is then deposited on the structure obtained. The membrane 13 marries with the upper face of the structure by surrounding the existing sacrificial material.

FIGS. 2A to 2F are views explaining a second embodiment according to the invention.

FIG. 2A shows a substrate 20, the constitution of which is not detailed. As for the first embodiment, a layer of sacrificial material 21 is deposited, for example a layer of $SiO_2$. On the sacrificial layer 21 is deposited a first layer membrane 24 in a non-porous material (see FIG. 2B).

The conventional integration steps are then pursued:
- definition of an interconnection track by a process of lithography using a layer of resin 22 or a hard mask on the first layer of membrane 24 (see FIG. 2C),
- etching of the first layer of membrane 24 and of the sacrificial layer 21 through the mask 22 until the substrate 20 is revealed (see FIG. 2D),
- elimination of the mask, revealing the existing parts of the sacrificial material 21 covered by the non-porous material 24 (see FIG. 2E).

A second layer of porous material membrane 23 (see FIG. 2F) is then deposited on the structure obtained. The second layer of membrane 23 marries with the upper face of the structure by surrounding the existing sacrificial material and the existing part of the first layer of membrane. In this way, a membrane, consisting of the association of parts of the first layer of membrane and of the second layer of membrane, is obtained for the second time.

The properties of this membrane are the key point of the invention: it must be sufficiently rigid to be self supporting with the patterns drawn on the lithography mask and dependent on the zones where the gaps have actually been produced. Indeed, according to the embodiments and extraction methods chosen, the extraction of the sacrificial material will be total or partial, which will be able sometimes to consolidate the structure (in particular on zones referred to as relaxed (wide patterns), the problem not being posed for narrow patterns, as will be shown further on. In this case, it will be recalled that the case of narrow patterns corresponds to zones where the air gap is required to ensure the performances of the integrated circuits.

The properties sought for the membrane will now be explained by referring to FIGS. 3 to 7.

FIG. 3 shows a structure produced from a substrate 30 by the method according to the invention and before extracting the sacrificial material 31. The structure incorporates two types of track retaining the sacrificial material 31 between the membrane 33 and the substrate 30: the narrow patterns 35 and the wide patterns 36. By narrow track is meant a track such that its dimensions do not produce the effect referred to as "collapse" (bonding of the patterns) during the step to extract the sacrificial layer. This effect depends in particular on the Young's modulus of the membrane and the conditions of the drying process.

FIGS. 4 to 7 show the results obtained after the step of extracting the sacrificial material and according to the different characteristics of the membrane.

Figure 4:
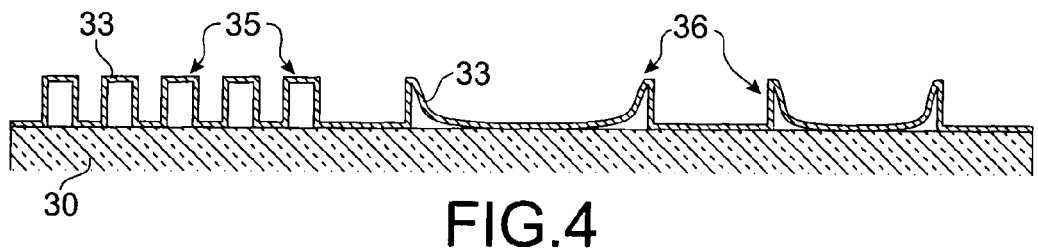
FIGS. 4 to 7 are views of different structures obtained by the method according to this invention, after the step of extracting the sacrificial material and dependent on the different characteristics of the membrane.

FIG. 4 illustrates the case of extraction of the sacrificial material in the entire volume surrounded by the membrane 33. This figure shows a case where the membrane 33 is not supported in the wide patterns 36. The membrane is bonded to the substrate 30 in the wide track zones. This problem can be related to a lack of rigidity of the membrane. It can also be related to the method of extraction used and attributable to the surface tension forces induced during the drying of the structure, for example. The case illustrated by FIG. 4 is inappropriate for wide patterns.

Figure 5:
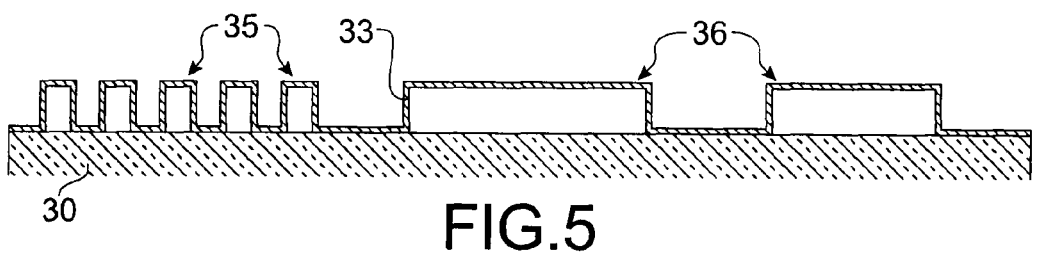

FIG. 5 illustrates the case of extraction of the sacrificial material in the entire volume surrounded by the membrane 33. This figure shows a case where the membrane 33 is supported both in the wide patterns 35 and in the narrow patterns 36. The membrane does not bond to the substrate because it is sufficiently rigid not to be distorted.

Figure 6:
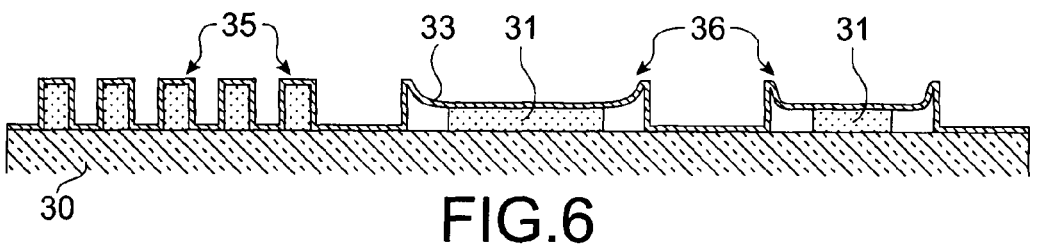

FIG. 6 illustrates the case of partial extraction of the sacrificial material: the sacrificial material is not extracted over the whole of the volume by the membrane 33. It is extracted partially over the height in the patterns 36. This case is to be avoided because it can provoke problems following the later depositing of interconnections.

Figure 7:
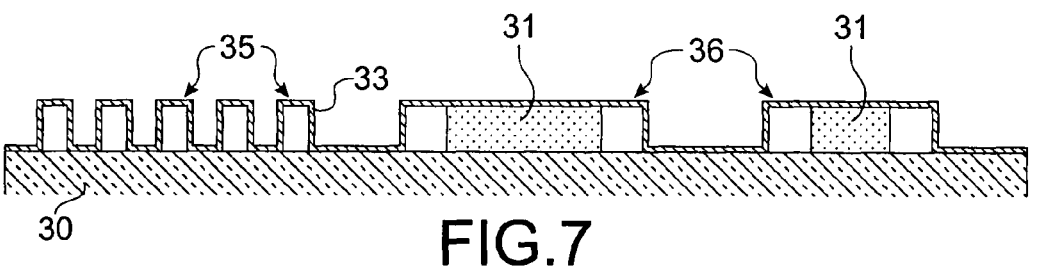

FIG. 7 illustrates the case of partial extraction of the sacrificial material 31. The sacrificial material is not extracted over the whole of the volume. The extraction takes place only on the walls. This may be due to the method of depositing the membrane 33. An anisotropic depositing of the membrane can lead to a lower membrane thickness on the walls of the patterns than on the crowns, which makes diffusion of the attack agent in a given direction easier. This case results from a satisfactory compromise and can be sought advantageously in the case of wide patterns.

The idea of depositing the membrane in two steps may be adopted to give precedence to the zone where the gas will be more preferably formed and to favour more particularly the configuration described in FIG. 7, the most favourable case for consolidation of the structure.

The other properties required for implementation of the invention are principally:

the fact of being able to deposit the material on etched structures, which involves depositing methods, for example, of the PECVD type and not of the type by rotation (or "spin-on" depositing);

possible diffusion of the attack agent and the residues resulting from the chemical reaction of the decomposition of the sacrificial material (thermal or by plasma, etc.) in order to preserve the electrical properties.

The most interesting materials today for this type of application are typically SiC materials which, depending on the precursors used, can for the same type of deposit obtain a layer more or less porous to a solution of hydrofluoric acid (selectivity in terms of speed of diffusion of the solutions in the layer according to these characteristics. For example, the SiC referred to as "Karha" is impermeable in the thickness ranges used currently in "Back-End" to a solution of hydrofluoric acid in the vapour phase, whereas DMPS SiC (dimethylphenylsilane SiC) is permeable to this solution. The conjoint use of these deposits can produce this type of application. Certain organic polymers based on carbon and hydrogen are resistant to hydrofluoric acid as a vapour and can also be used in this type of application.

As to the other properties required, we can also mention:

extraction of the sacrificial material by various methods described earlier (thermal, chemical, plasma, etc.)

the possibility of performing a metallization step (sometimes a diffusion barrier, depositing of a copper-type conducting material, mechano-chemical polishing, depositing of the barrier autopositioned if necessary, etc.).

These properties should be reproduced on the upper levels as many times as necessary.

Figure 8A:
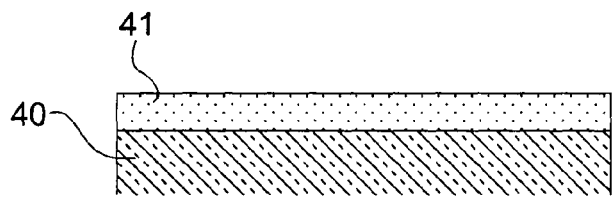
FIGS. 8A to 8U illustrate a method for manufacturing an interconnection structure with air gaps for an integrated circuit according to a more preferred embodiment of the invention.
Figure 8B:
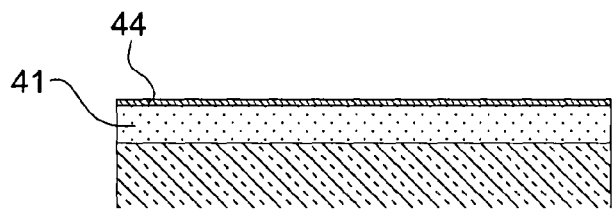
Figure 8C:
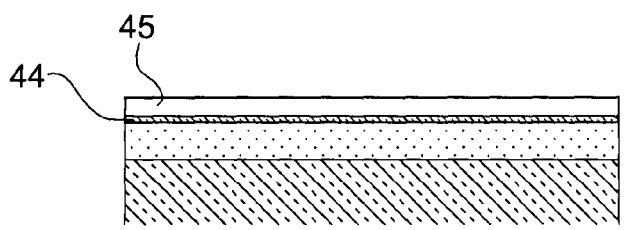
Figure 8D:
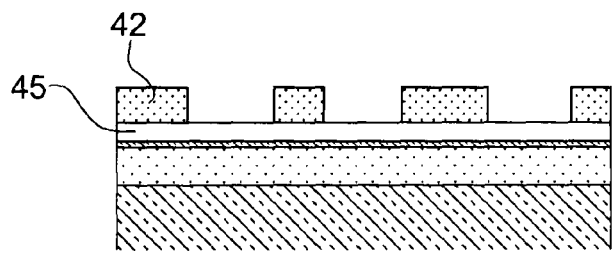
Figure 8E:
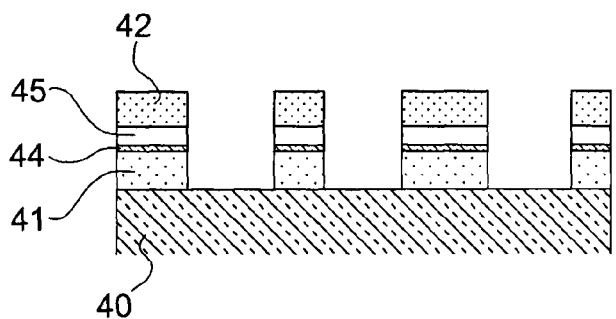
Figure 8F:
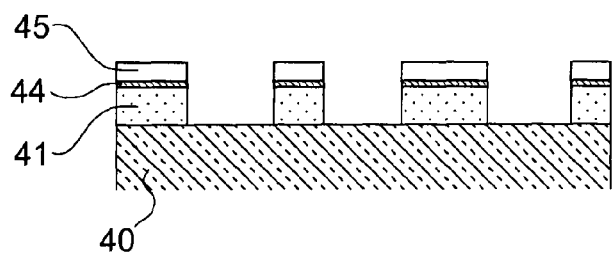
Figure 8G:
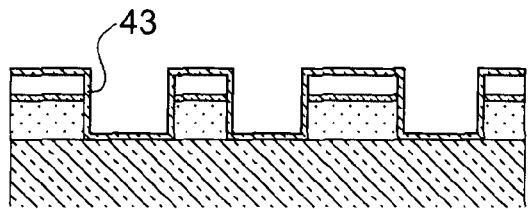
Figure 8H:
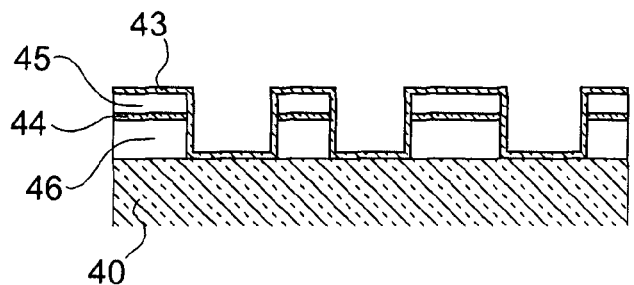
Figure 8I:
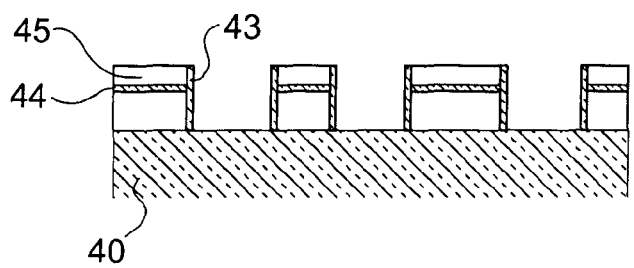
Figure 8J:
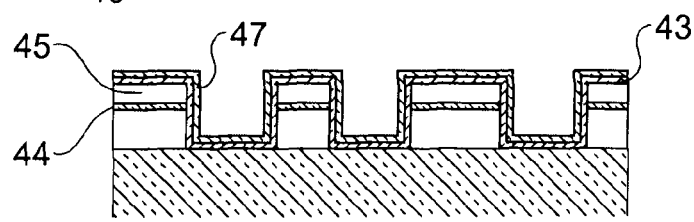
Figure 8K:
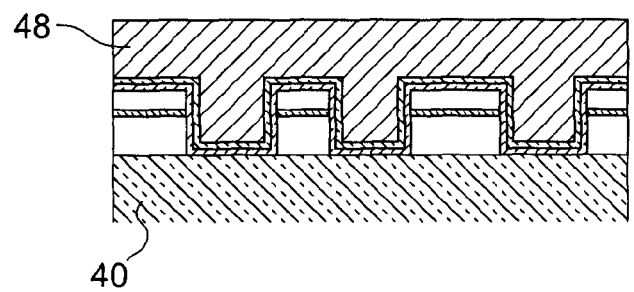
Figure 8L:
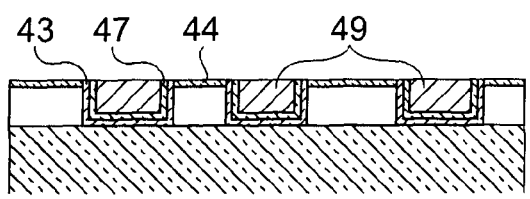
Figure 8M:
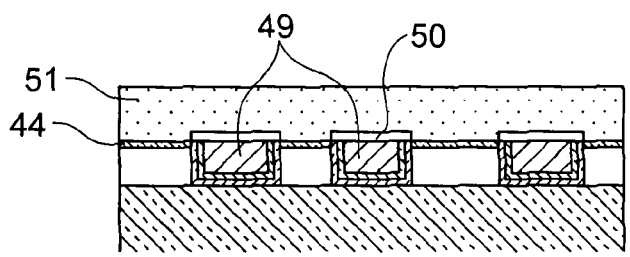
Figure 8N:
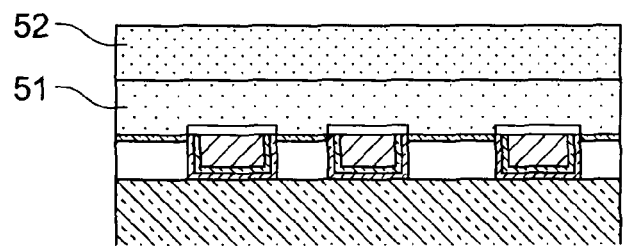
Figure 8O:
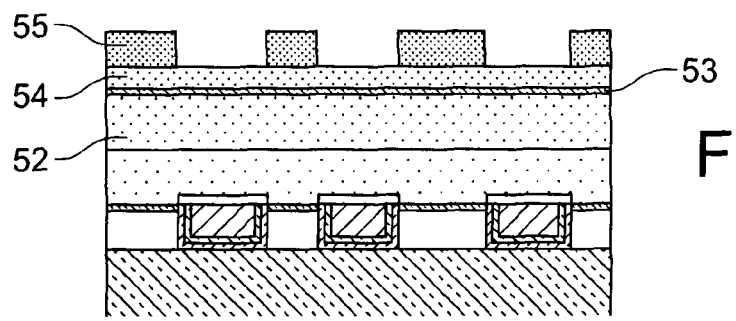
Figure 8P:
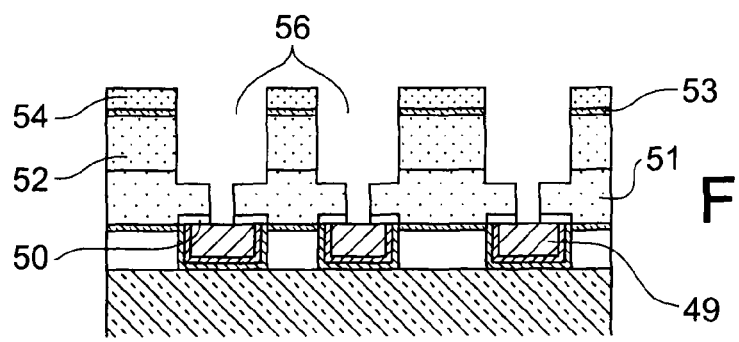
Figure 8Q:
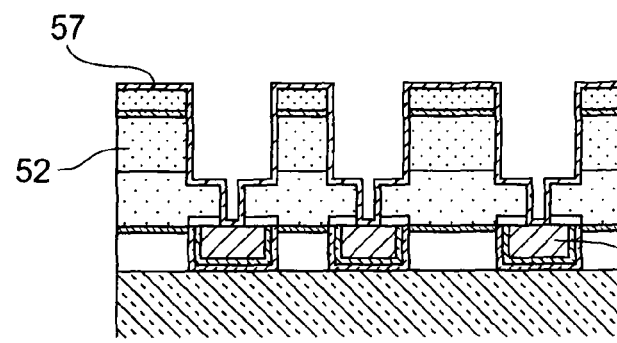
Figure 8R:
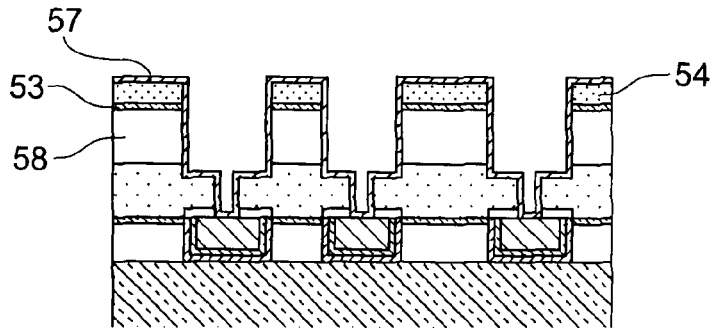
Figure 8S:
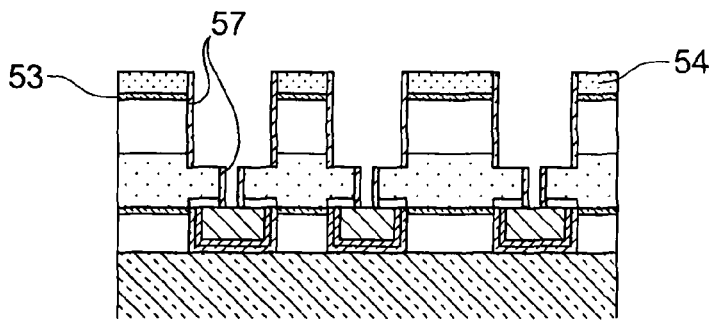
Figure 8T:
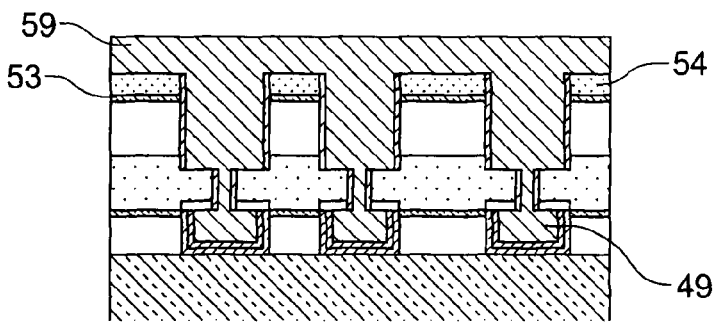
Figure 8U:
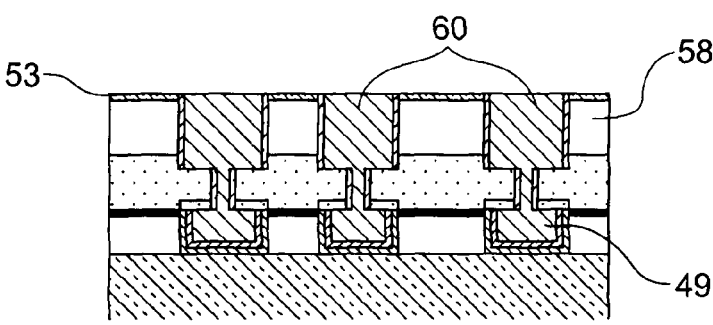

FIGS. 8A to 8U illustrate a method for manufacturing an interconnection structure with air gaps for an integrated circuit according to a more preferred embodiment of the invention. This is an embodiment where we seek to avoid collapse of the membrane (if this does not have the required rigidity qualities) on releasing the air gaps (case illustrated by FIG. 7). This is currently the most realistic example. FIGS. 8A to 8H show the successive integration steps for producing air gaps at the first level when using $SiO_2$ as the sacrificial material.

FIG. 8A shows a substrate 40, the constitution of which is not detailed. On the substrate 40 is deposited a layer of sacrificial material 41 consisting of $SiO_2$ of a thickness which can be up to 400 nm, advantageously between 50 and 150 nm inclusive, for example between 80 and 120 nm.

On top of the layer of sacrificial material 41 is deposited a layer 44 of a material which can be porous or permeable, for example a material of the SiC type, of a thickness which can be up to 60 nm (see FIG. 8B). The interest in using a dense material, and thus impermeable to the attacking chemical solution (a material of the Karha SiC type) is that it is then possible to localise the air gaps and thus maintain a certain rigidity of the structure for wide patterns. This can avoid problems with collapse and localise the air gaps over the dense zones. The conventional integration route, familiar to those skilled in the art, is then followed.

FIG. 8C shows the structure obtained after depositing a layer 45 of a material forming a hard mask over the layer 44. The layer 45 can be a layer of amorphous carbon, TiN or silicon oxide, toped with a layer of TiN and being up to 60 nm in thickness, advantageously up to 40 nm in thickness.

FIGS. 8D to 8F illustrate the conventional integration steps:

lithography of a layer of resin 42 (see FIG. 8D), etching of the layer 45 of material forming a hard mask, of the layer 44 of SiC and of the layer of sacrificial material 41 until the substrate 40 is revealed (see FIG. 8E), elimination of the resin mask, revealing the existing parts of the sacrificial material 41 covered successively by material of the SiC 44 type and the material forming the hard mask 45 (see FIG. 8F).

A layer 43 of material porous to the extracting agent is then deposited on the structure obtained (see FIG. 8G). The porous material of the layer 43 has not only the property of being capable of diffusing the chemical agent through the layer 43, but also the property of allowing the residues resulting from the reaction to diffuse. By way of example, the layer 43 can be DMPS SiC and be up to 40 nm in thickness and advantageously up to 10 nm in thickness for an extraction agent consisting of a solution of hydrofluoric acid.

The membrane thus comprises several layers: the existing parts of the layer 44, the existing parts of the layer 45 and the layer 43.

FIG. 8H shows the structure obtained after extracting the sacrificial material. The layer 43 closes the future air gaps 46.

The part of the porous material of the layer 43 deposited in the bottom of the line, i.e. on the substrate 40 or later in the bottom of the traverses (during multi-level integration), can be eliminated without any deleterious consequence to the structure. This step can be done before or after production of the air gaps. FIG. 8I represents the structure obtained after eliminating the porous material from the layer 43 in the bottom of the tracks.

After the step to release the membrane, a metallic deposit for the future connection tracks can be made according to a conventional route, i.e. we deposit a diffusion barrier 47 on the structure obtained previously as shown in FIG. 8J. It will be noted that the structure of FIG. 8J corresponds to the case where the porous material of the layer 43 is maintained in the bottom of the track. The diffusion barrier 47 can be of the Ta/TaN type and be between 1 and 20 nm in thickness, for example between 15 and 20 nm in thickness.

One of the advantages of the method according to the invention compared with the method described in the document FR-A-2 851 373 is that neither the diffusion barrier, nor the metallic deposit intended to constitute the connection tracks are subjected at any time to the chemical solution attacking the sacrificial layer. This implies that, with the reduction of the dimensions, and consequently the reduction of the thickness of the materials used (in particular as regards the diffusion barriers), the "criticality" of the approach with the development of the technological nodes should be minimised.

A layer of copper 48 sufficiently thick to make good the hollow zones of the structure is then deposited (see FIG. 8K). The copper is deposited by electrochemical depositing ECD or by PVD depositing.

FIG. 8L shows the structure obtained with a mechano-chemical planarisation step. This step was performed in a manner so as to leave only the layer 44 while closing the air gaps. The copper tracks 49 are clad successively by the barrier layer 47 and the layer of porous material 43.

A first level of connections has been produced in this way. The production of a second level of connections can be considered using the same principle.

The top level of metallization (traversed levels or vias) then consists of a dielectric material, for example of the methyl-silsesquioxane (MSQ) type, a hybrid material between $SiO_2$ and an organic polymer. We can also quote organic polymers, including, inter alia, polynorbomenes, photosensitive polyimides, polyarylenes such as SILK™ or GX-3™ and polyarylethers such as FLARE™. The integration of the second level of metal is applied with $SiO_2$ following the "double damascene" route.

FIG. 8M shows the structure obtained previously with, on the copper tracks 49, a protective layer 50 forming an auto-aligned diffusion barrier, alloyed with CoWB, CoWP or CoWP/B (deposit in aqueous solution) or CuSiN (deposit by a plasma process). Then, a layer 51 of dielectric material of the type cited just above is deposited.

On the layer 51 of dielectric material is then deposited a layer of sacrificial material 52, for example $SiO_2$ (see FIG. 8N).

After depositing the sacrificial layer 52, a layer of membrane 53 in porous or non-porous material of the SiC type, of a thickness which can be up to 60 nm, is deposited on the sacrificial layer 52. A hard mask layer 54 (of the TiN or amorphous carbon type) is then deposited. We then manufacture a mask 55 to produce the double damascene structure (see FIG. 8O). The openings of the mask 55 are positioned to allow the formation of vias up to the first level of connections.

The structure is then etched to form the vias. A slight over-etching of the material constituting the layer 51 is stipulated to procure an opening on each track 49 in question. Accordingly, the openings 56 are produced in the layers 54, 53 and 52 with an extension into the layer 51 and the protection layer 50 (see FIG. 8P).

A layer 57 of material porous to the solution attacking the sacrificial layer 52 is then deposited. This layer 57 covers the entire free area of the structure up to the surface of the tracks 49 revealed with the preceding step (see FIG. 8Q).

The sacrificial material 52 is then extracted to obtain the second level of metallization (see FIG. 8R).

We then eliminate the parts of the layer 57 located on the crowns (horizontal parts), whereas the parts of the layer 57 located on the walls are preserved (see FIG. 8S).

A layer of copper 59 is deposited uniformly on the structure obtained with the preceding step (see FIG. 8T). It ensures electrical contact with the tracks 49 which it is intended to contact.

A mechano-chemical polishing is then performed (see FIG. 8U) to individualise the traverses 60 making contact with the tracks 49. The polishing eliminates the existing hard mask layer 54. The parts of the layer of membrane 53 present only on the traverses 60 are also eliminated so as to maintain the air gaps 58. The structure is then ready for production of a supplementary level if necessary.

The invention claimed is:

1. A method for manufacturing a structure of electrical interconnections for an integrated circuit, the method comprising the steps of:

depositing a layer of sacrificial material on a substrate, etching the layer of sacrificial material to form openings, depositing, on an etched surface of the layer of sacrificial material, a layer of a permeable membrane that is permeable to an attack agent configured to break down the sacrificial material, breaking down the sacrificial material by using the attack agent to form the air gaps to replace the broken down sacrificial material, the air gaps located between the openings, forming electrical conductors in the openings to obtain electrical conductors separated by air gaps to form the electrical interconnections after said step of breaking down the sacrificial material, depositing a layer of electrically insulating material on top of the electrical conductors to cover the electrical interconnections.

2. The method according to claim 1, further comprising a step of:

depositing, before the step of etching the sacrificial material, a membrane consolidation layer in a material more dense than the layer of membrane, which is etched during the etching step and which is not broken down by the attack agent.

3. The method according to claim 2, further comprising a step of:

depositing, before the step of etching the sacrificial material, a layer of mask material on the membrane consolidation layer.

4. The method according to claim 2, further comprising, after the step of depositing the permeable membrane of porous material and before the step of forming the electrical conductors, a step of eliminating parts of the layer of the permeable membrane located in a bottom of etched zones and on unetched parts of the layer of sacrificial material.

5. The method according to claim 2, wherein the step of forming the electrical conductor further comprises:

depositing a layer of an electrically conducting material with an etched pattern filling, mechano-chemical polishing that is performed until the membrane consolidation layer is revealed.

* * * * *